(12) United States Patent
Jefremow et al.

(10) Patent No.: US 11,942,959 B2
(45) Date of Patent: Mar. 26, 2024

(54) CALIBRATION WITH FEEDBACK SENSING (71) Applicant: Infineon Technologies AG, Neubiberg (DE)

(72) Inventors: Mihail Jefremow, Augsburg (DE); Stefan Koeck, Ottenhofen (DE); Ralph Mueller-Eschenbach, Munich (DE); Juergen Schaefer, Oberhaching (DE); Arndt Voigtlaender, Ottobrunn (DE); David Zipperstein, Munich (DE)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 17/487,199

(22) Filed: Sep. 28, 2021

(65) Prior Publication Data
US 2023/0106703 A1 Apr. 6, 2023

(51) Int. Cl.
| H03M 1/20 | (2006.01) |
| H03M 1/06 | (2006.01) |
| H03M 1/10 | (2006.01) |
| H03M 3/00 | (2006.01) |

(52) U.S. Cl.
CPC ....... H03M 1/1014 (2013.01); H03M 1/0626 (2013.01); H03M 3/464 (2013.01)

(58) Field of Classification Search
CPC .. H03F 3/217; H03F 3/2175; H03F 2200/331; H03F 2200/351; H03F 2200/03; H03F 1/3241; H03F 1/3247; H03F 2200/102; H03F 2200/372; H03F 3/2171; H03F 3/2178; H03F 1/0222; H03M 1/1009; H03M 3/506; H03M 3/358; H03M 1/12; H03M 1/1235; H03M 1/66; H03M 3/37; H03M 3/504
USPC ................................ 341/118–120, 143, 110
See application file for complete search history.

(56) References Cited

U.S. PATENT DOCUMENTS

| 5,592,165 A * | 1/1997 | Jackson | H03M 3/504 341/145 |
| 5,659,312 A * | 8/1997 | Sunter | H03M 1/1095 341/120 |
| 6,408,034 B1 * | 6/2002 | Krone | H04M 11/06 375/365 |
| 7,315,157 B2 * | 1/2008 | Chapuis | H02M 3/157 323/282 |
| 7,362,247 B2 * | 4/2008 | Arias | H03M 3/388 341/120 |
| 7,373,527 B2 * | 5/2008 | Chapuis | H02M 3/285 307/29 |

(Continued)

Primary Examiner — Linh V Nguyen
(74) Attorney, Agent, or Firm — Banner & Witcoff Ltd.

(57) ABSTRACT

A calibration circuit, including: a signal generator circuit configured to generate a modulated analog input signal, which is based on a digital input word that is modulated; an Analog-to-Digital Converter (ADC) configured to convert an analog reference signal to a digital calibration word, wherein the analog reference signal is a low-pass-filtered version of the analog input signal generated by the signal generator circuit; and a feedback circuit configured to output the digital input word by adjusting the digital calibration word depending on a digital feedback signal, which is based on a modulated version of the analog reference signal, wherein the signal generator circuit, the ADC, and the feedback circuit are provided on a same chip.

23 Claims, 5 Drawing Sheets (56) References Cited

U.S. PATENT DOCUMENTS

| | | | | |
|---|---|---|---|---|
| 7,554,310 | B2* | 6/2009 | Chapuis | H02M 3/157 |
| | | | | 341/114 |
| 7,622,820 | B1* | 11/2009 | Prodic | H02M 3/158 |
| | | | | 361/689 |
| 7,710,092 | B2* | 5/2010 | Chapuis | H02M 3/1588 |
| | | | | 323/282 |
| 9,099,961 | B2* | 8/2015 | Kay | H03F 3/195 |
| 9,344,046 | B2* | 5/2016 | Wang | H03F 3/2175 |
| 9,621,177 | B1* | 4/2017 | Jun | H03M 1/1033 |
| 9,628,040 | B2* | 4/2017 | Lesso | H03F 1/32 |
| 11,503,404 | B1* | 11/2022 | Hernandez | H03F 3/183 |
| 2009/0167431 | A1* | 7/2009 | Guilherme | H03F 3/2173 |
| | | | | 330/10 |
| 2010/0295716 | A1* | 11/2010 | Yamaki | H03M 1/0863 |
| | | | | 341/155 |
| 2015/0381119 | A1* | 12/2015 | Lu | H03F 3/2173 |
| | | | | 330/251 |
| 2017/0366385 | A1* | 12/2017 | Roger | H04L 27/02 |
| 2019/0293695 | A1* | 9/2019 | Guthrie | G01R 19/0038 |
| 2020/0186921 | A1* | 6/2020 | Palit | H03G 7/002 |

* cited by examiner

CALIBRATION WITH FEEDBACK SENSING

BACKGROUND

Analog-to-digital converter (ADC) sensitivity may be defined by differential non-linearity (DNL) and integrated non-linearity (INL). DNL is a deviation between an actual analog input signal and an ideal analog input signal for a given digital output word. INL is an integrated DNL. Measurements of DNL and INL require a special printed circuit board (PCB) design and equipment.

Figure 3:
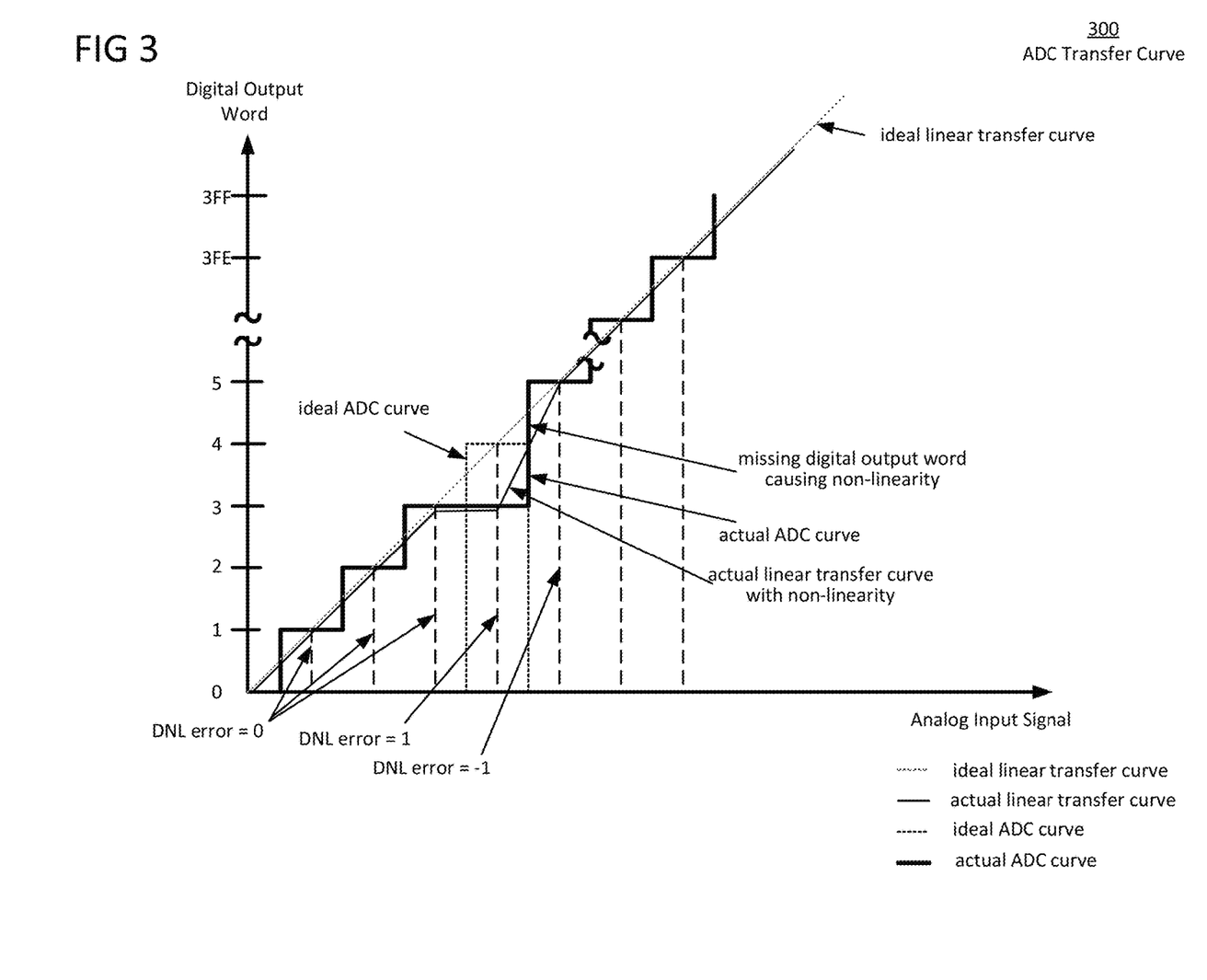
FIG. 3 illustrates an analog-to-digital converter transfer curve.

FIG. 3 illustrates an ADC transfer curve 300. The x-axis represents the analog input signal, and the y-axis represents the digital output word. The ideal transfer curve is a monotonic step function having a same number of steps in each voltage region, which in this example, after each least significant bit change in the analog input signal, the digital output word changes by one. This ideal linear transfer curve is generally represented as a linear line. The actual transfer curve, however, may have a step shifted to the left or right due to a missing digital output word. This means there needs to be perhaps twice the least significant bit for there to be a digital output word change, or the digital output word may change not by one word, but by two. A DNL error of 0 means the steps are accurate, a DNL error of 1 means one more step is needed, and a DNL error of −1 is when there is a missing digital output word or the output word changes by two least significant bits (LSBs). This DNL error results in the actual transfer curve having non-linearity as shown.

There is increasing interest in better DNL and INL performance for ADCs used for applications such as vehicle state modeling with Kalman filters, as the gain and offset errors are canceled out. System designers want to know the ADC performance (DNL, INL, noise . . . ) in a final application, including the PCB, external components, software stack, supply and ground noise, etc.

DETAILED DESCRIPTION

The present disclosure is directed to adaptive linearization calibration for a system with respect to ADC performance in a final application based on DNL/INL.

Figure 1A:
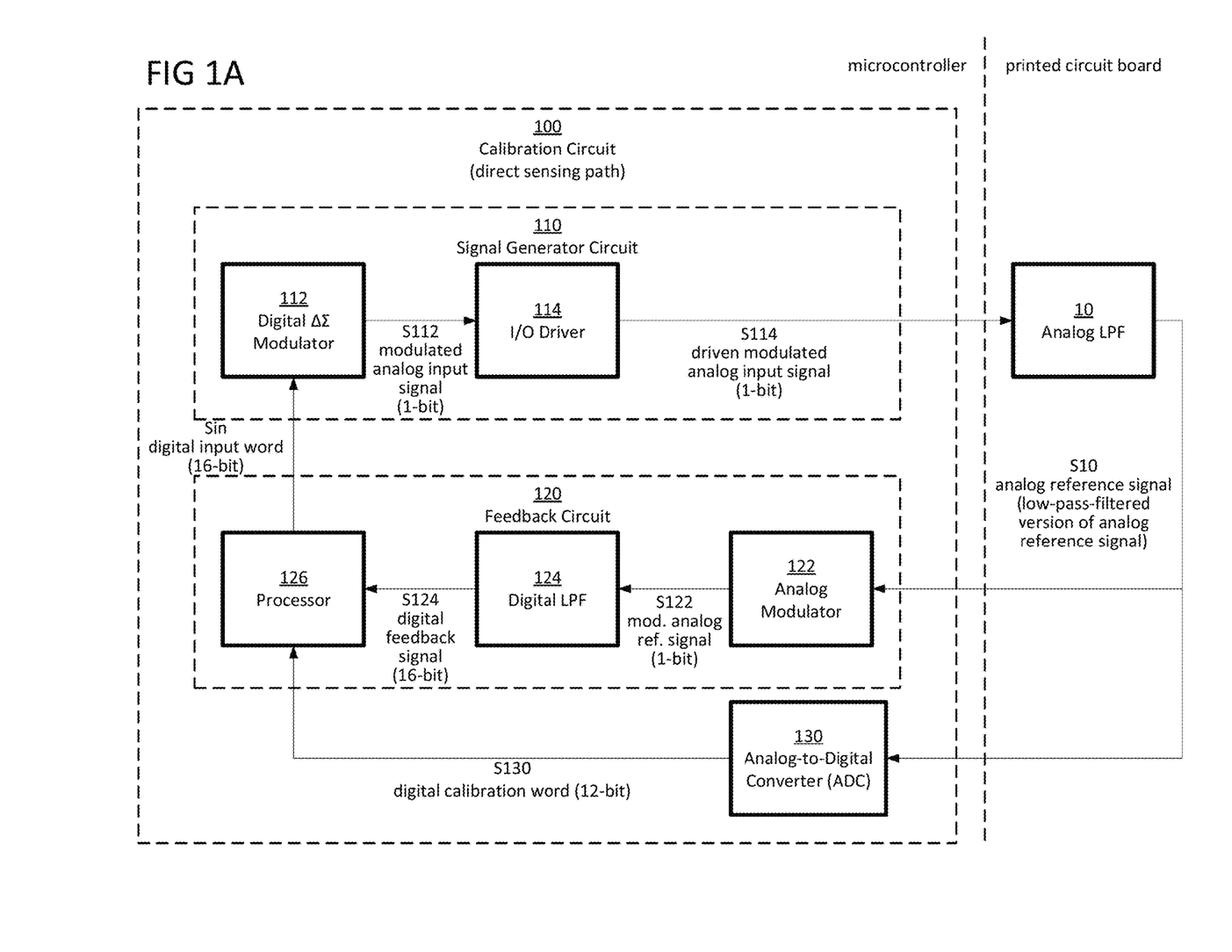
FIG. 1A illustrates a schematic diagram of a calibration circuit with a direct sensing path in accordance with aspects of the disclosure.

FIG. 1A illustrates a schematic diagram of a calibration circuit 100 with a direct sensing path in accordance with aspects of the disclosure.

The calibration circuit 100 comprises a signal generator circuit 110, a feedback circuit 120, and an Analog-to-Digital Converter (ADC) 130. The signal generator circuit 110, the feedback circuit 120, and the ADC 130 are provided on a same chip, which may be that of a microcontroller. The calibration circuit 100 is coupled to an analog Low Pass Filter (LPF) 10 that is not on the same chip as the calibration circuit 100, although the disclosure is not necessarily limited in this respect.

The signal generator circuit 110 comprises a digital delta sigma (ΔΣ) modulator 112 and an input/output (I/O) driver 114. The signal generator circuit 110 is configured to generate and drive an analog input signal S114 for input to the analog LPF 10, and which is based on a digital input word Sin that is modulated S112. More specifically, the digital ΔΣ modulator 112 is configured to modulate the digital input word Sin to output the analog input signal S112. The driver 114, which is coupled to the ΔΣ modulator 112, is configured to drive the analog input signal S112 from the digital ΔΣ modulator 112 to output the analog input signal S114. The I/O driver is the significant contributor to analog signal S10 inaccuracies, because of the non-linearity in the I/O driver, disturbing the 1-bit PDM modulation information after the driver.

The ADC 130 is configured to convert an analog reference signal S10 to a digital calibration word S130 used for calibration of the ADC 130. The analog reference signal S10 is a low-pass-filtered version of the analog input signal S114 generated by the signal generator circuit 110. The ADC 130 may be a sample-and-hold ADC, a successive approximation register (SAR) ADC, or a pipelined ADC, for example. And the system being calibrated may comprise a microcontroller.

The feedback circuit 120 comprises an analog modulator 122, a digital low pass filter (LPF) 124, and a processor 126. The feedback circuit 120 is configured to output the digital input word Sin depending on a digital feedback signal S124, which is based on a modulated analog ref signal S122 of the analog reference signal S10. More specifically, the analog modulator 122 is configured to modulate the analog reference signal S10 into the modulated analog reference signal S122. The digital LPF 124 is coupled between the analog modulator 122 and the processor 126, and is configured to low-pass-filter the analog modulated analog reference signal S122 to output the digital feedback signal S124. And the processor 126 is configured to output the digital input word Sin of the signal generator circuit 110 by adjusting the digital calibration word S130 based on the digital feedback signal S124. The processor 126 may be software, firmware, and/or hardware-based. The digital LPF 124 may comprise a cascaded integrator-comb (CIC) filter and/or a finite impulse response (FIR) filter.

The analog reference signal S10 corresponds with the analog input signal on the x-axis of the ADC transfer function 300 of FIG. 3. The ADC 130 is the ADC under test. And the digital calibration word S130 corresponds with the digital output word on the y-axis of the ADC transfer function 300 of FIG. 3. The ideal ADC curve is a step function in LSB steps for a linear voltage ramp on the input. But the actual ADC curve deviates from the ideal stepwise function ADC curve. The ADC 130 has non-linearity, which causes inaccuracies visible at the digital output word. To be able to characterize the non-linearity of the ADC, the analog reference signal S10 needs to be more accurate than the ADC under test. The inaccuracies in analog reference signal S10 are mainly caused by the I/O driver 114. This is due to a pull-up pull-down circuit 114.2 (shown in FIG. 1B) of the I/O driver 114 having asymmetry between a pull-up of the PMOS versus a pulldown of the NMOS, and its filtered transfer function results a deviation in analog reference signal S10. This is especially the case if the I/O driver 114 output (driven analog input voltage 114) is close to half of the maximum input voltage when both the PMOS and NMOS are alternatingly active. The feedback circuit 120 in combination with the signal generator circuit 110 improves the quality of the analog reference signal S10.

The digital calibration word S130 can be used for the final application. After the calibration, the ADC 130 error may be provided to be used to compensate for nonlinear errors of the ADC. The calibration may be performed at system start-up or during run time. Since the sensitivity of the ADC 130 is more accurate, the calibration disclosed herein avoids a need for an application to have as significant a non-linearity margin for error for the entire voltage and temperature range in volume production.

The digital ΔΣ modulator 112 and analog modulator 122 are of corresponding types. The digital ΔΣ modulator 112 may be a High Speed Pulse Density Modulator (HSPDM), and the analog modulator 122 may be an Enhanced Delta-Sigma (EDS) ADC. Alternatively, the digital ΔΣ modulator 112 may be a delta-sigma Digital-to-Analog Converter (DAC), and the analog modulator 122 a delta-sigma ADC. The digital ΔΣ modulator 112 may be a digital pulse frequency modulator, and the analog modulator 122 an analog pulse frequency modulator. The digital ΔΣ modulator 112 may be a digital pulse width modulator, and the analog modulator 122 an analog pulse width modulator. Or the digital ΔΣ modulator 112 be a digital pulse code modulator, and the analog modulator 122 an analog pulse code modulator. These digital and analog modulators are examples and not meant to be limiting.

Figure 1B:
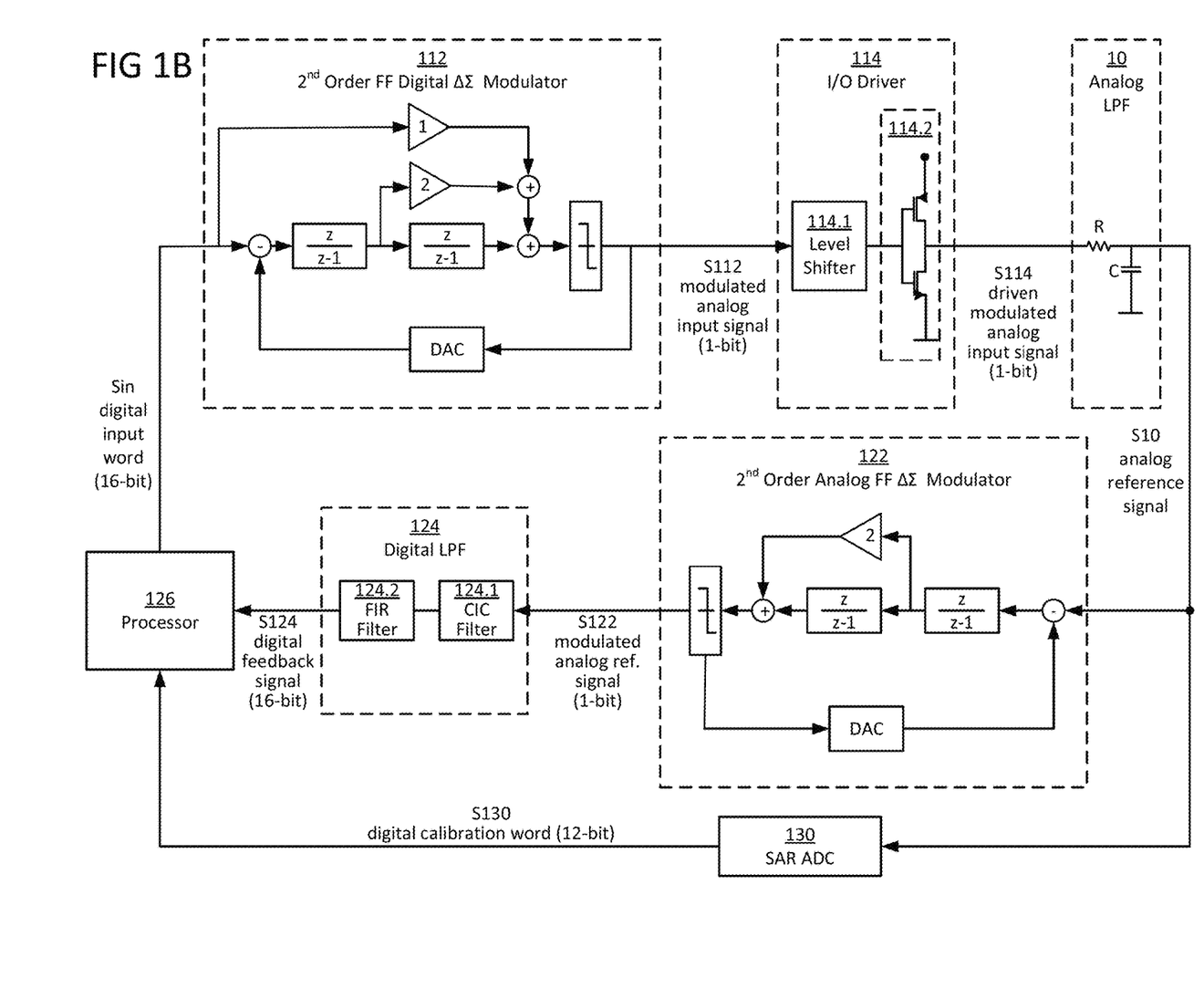
FIG. 1B illustrates a schematic diagram of specific examples of components of the calibration circuit of FIG. 1A.

FIG. 1B illustrates a schematic diagram of a specific examples of components of the calibration circuit 100 of FIG. 1A. The digital ΔΣ modulator 112 is a second order feed-forward (FF) digital delta sigma (ΔΣ) modulator. The I/O driver 114 comprises a level shifter 114.1 and a pull-up pull-down circuit 114.2. The analog LPF 10 comprises a resistor capacitor (RC) circuit. The analog modulator 212 is a second order feed-forward (FF) analog delta sigma (ΔΣ) modulator. And the digital LPF 124 comprises a cascaded integrator-comb (CIC) filter 124.1 coupled with a finite impulse response (FIR) filter 124.2. This figure is provided merely as an example and not meant to be limiting. Also, the operations of the specific components should be understood by those of skill in the art, and for the most part, are outside the scope of this disclosure. For the sake of brevity and to not obscure more important aspect of the disclosure, detailed descriptions of these components are not provided here.

Figure 2A:
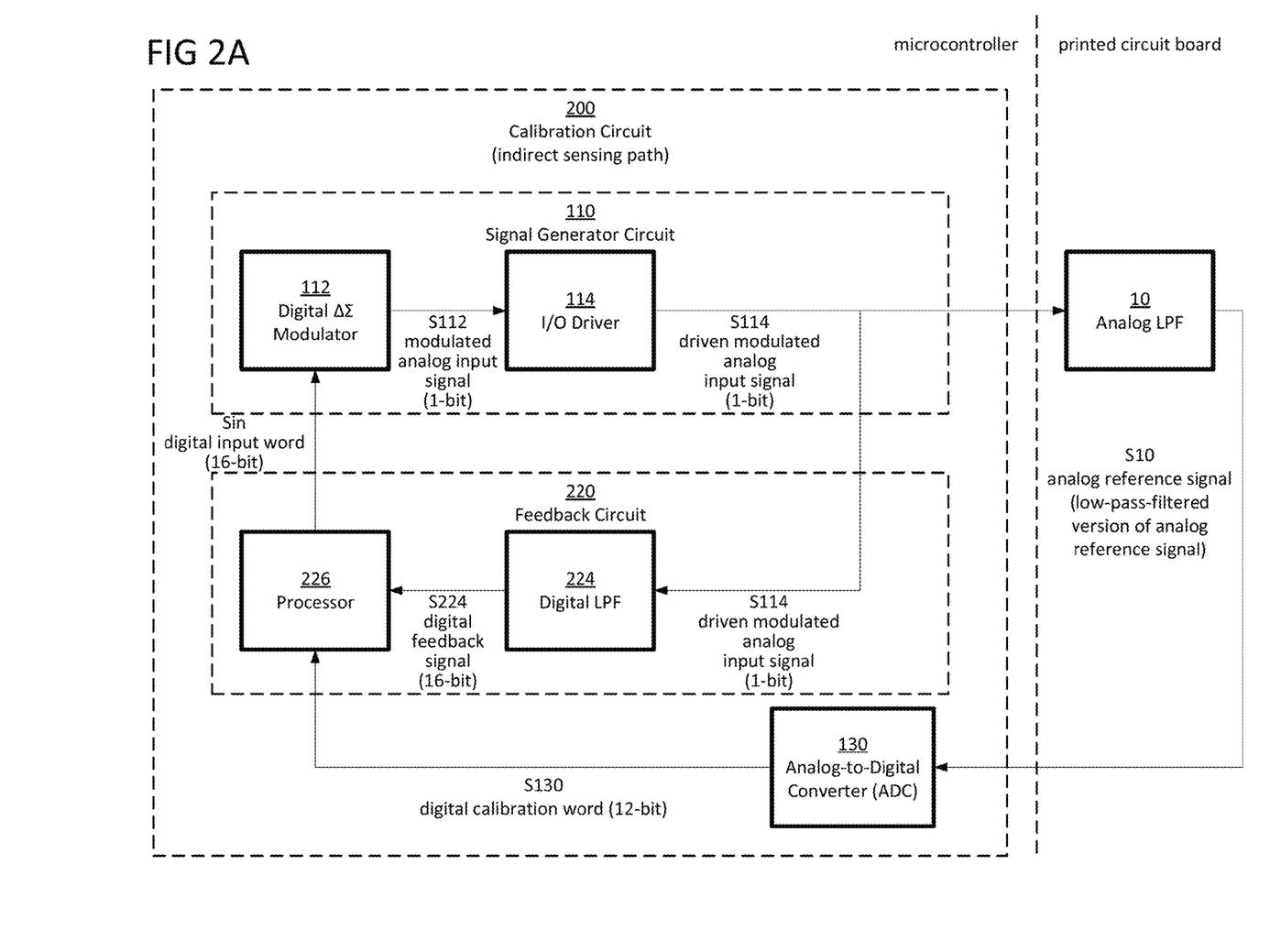
FIG. 2A illustrates a schematic diagram of a calibration circuit with an indirect sensing path in accordance with aspects of the disclosure.

FIG. 2A illustrates a schematic diagram of a calibration circuit 200 with an indirect sensing path in accordance with aspects of the disclosure.

The calibration circuit 200 is similar to the calibration circuit 100 of FIG. 1A, except that the feedback circuits 120 and 220 differ slightly. The feedback circuit 120 of FIG. 1A has a direct sensing path from the analog reference signal S10. On the other hand, this feedback circuit 220 has an indirect sensing path from the driven analog input signal S114.

The calibration circuit 200 comprises the signal generator circuit 110, a feedback circuit 220, and the ADC 130. The signal generator circuit 110, the feedback circuit 220, and the ADC 130 are provided on a same chip. The calibration circuit 200 is coupled to the analog LPF 10, which is not on the same chip as the calibration circuit 200, although the disclosure is not necessarily limited in this respect.

The signal generator circuit 110, its components modulator 123 and I/O driver 114, and the ADC 130 are described above with respect to the calibration circuit 100 of FIG. 1A.

The feedback circuit 220 comprises a digital LPF 224 and a processor 226. There is no analog modulator as in the feedback circuit 120 of FIG. 1A. The digital LPF 224 thus receives the digital signal directly from the I/O. More specifically, in FIG. 1A described above, the LPF 124 receives the modulated analog reference signal S122 from the analog modulator 122, which modulates the analog reference signal S10. In contrast, this LPF 224 receives the driven modulated analog input signal S114 from the signal generator circuit 110.

The feedback circuit 220 is configured to output the digital input word Sin depending on a digital feedback signal S224, which is based on S114. More specifically, the processor 226 is configured to adjust the digital input word Sin based on the driven analog input signal S114 of the signal generator circuit 110. And the digital LPF 224, which is coupled to the processor 226, is configured to low-pass-filter the driven analog input signal S114 to output the digital feedback signal S224. The processor 226 may be software, firmware, and/or hardware-based. The digital LPF 224, like digital LPF 124, may comprise a CIC filter and/or a FIR filter.

Again, there is no analog modulator receiving an analog reference signal S10 from outside the calibration circuit as in calibration circuit 100 of FIG. 1A. Rather, the LPF 224 of the feedback circuit 220 receives from within the calibration circuit 200 the driven modulated analog input signal S114 from the I/O driver 114, which is a circuit element likely contributing to S10 analog reference signal inaccuracies. An advantage in this feedback circuit 220 is there is no analog modulator requiring additional area and current.

Figure 2B:
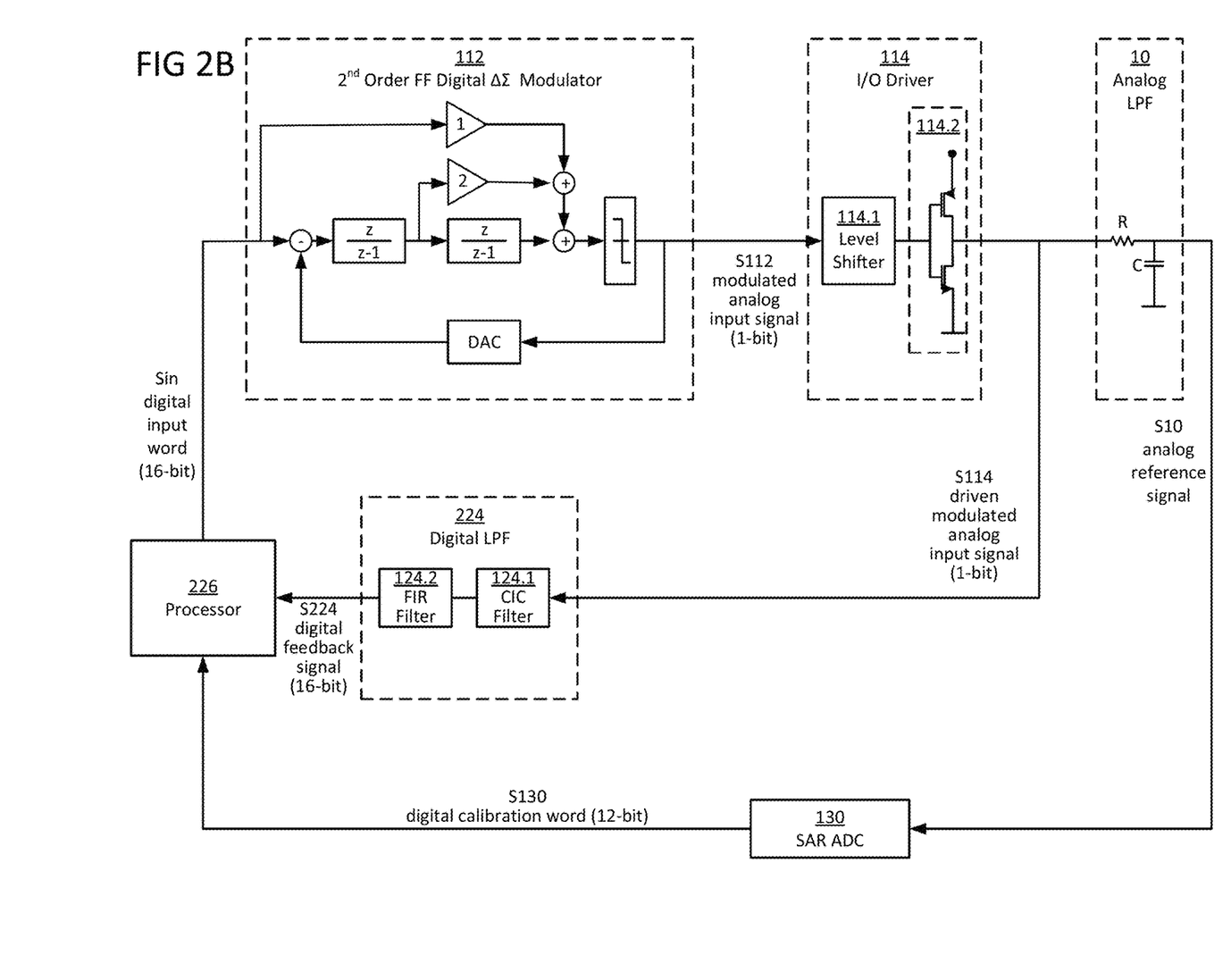
FIG. 2B illustrates a schematic diagram of specific examples of components of the calibration circuit of FIG. 2A.

FIG. 2B illustrates a schematic diagram of specific examples of components of the calibration circuit 200 of FIG. 2A. Specific examples of components of calibration circuit 200 are the same as that of the calibration circuit 100 of FIG. 1A discussed above, with the obvious exception of the analog modulator 122.

The aspects disclosed herein do not require an expensive external signal generator for ADC performance characterization. Measurements may be made during microcontroller runtime and under application conditions on a customer board; external measurements in a final application are not possible for the accuracies required. The aspects can be used as a tool for printed circuit board design assessment for ADC, and for DNL/INL assessment of a customer system. And the external analog LPF 10 may be reused for the measurement with no additional cost.

The techniques of this disclosure may also be described in the following examples.

Example 1. A calibration circuit, comprising: a signal generator circuit configured to generate a modulated analog input signal, which is based on a digital input word that is modulated; an Analog-to-Digital Converter (ADC) configured to convert an analog reference signal to a digital calibration word for measuring its DNL and INL performance, wherein the analog reference signal is a low-pass-filtered version of the analog input signal generated by the signal generator circuit; and a feedback circuit configured to output the digital input word by adjusting the digital calibration word depending on a digital feedback signal, which is based on a modulated version of the analog reference signal, wherein the signal generator circuit, the ADC, and the feedback circuit are provided on a same chip.

Example 2. The calibration circuit of claim 1, wherein the feedback circuit comprises: an analog modulator configured to modulate the analog reference signal into the modulated analog reference signal; and a processor configured to adjust the digital input word of the signal generator circuit based on the digital feedback signal.

Example 3. The calibration circuit of claim 2, wherein the feedback circuit further comprises: a digital Low Pass Filter (LPF), coupled between the analog modulator and the processor, and configured to low-pass-filter the modulated analog reference signal to output the digital feedback signal.

Example 4. The calibration circuit of claim 3, wherein the digital LPF is a cascaded integrator-comb (CIC) filter or a finite impulse response (FIR) filter.

Example 5. The calibration circuit of claim 2, wherein the signal generator circuit comprises: a digital modulator configured to modulate the digital input word to output the analog input signal.

Example 6. The calibration circuit of claim 5, wherein the signal generator circuit further comprises: a driver, coupled to the digital modulator, and configured to drive the modulated analog input signal from the digital modulator to output the modulated analog input signal.

Example 7. The calibration circuit of claim 5, wherein the digital modulator is a High Speed Pulse Density Modulator (HSPDM), and the analog modulator is an Enhanced Delta-Sigma (EDS) ADC.

Example 8. The calibration circuit of claim 5, wherein the digital modulator and analog modulator are of corresponding types.

Example 9. The calibration circuit of claim 8, wherein the digital modulator is a delta-sigma Digital-to-Analog Converter (DAC) and the analog modulator is a delta-sigma ADC, or the digital modulator is a pulse frequency digital modulator and the analog modulator is a pulse frequency analog modulator, or the digital modulator is a pulse width digital modulator and the analog modulator is a pulse width analog modulator, or the digital modulator is a pulse code digital modulator and the analog modulator is a pulse code analog modulator.

Example 10. The calibration circuit of claim 1, wherein the ADC is a sample-and-hold ADC, a successive approximation register (SAR) ADC, or a pipelined ADC.

Example 11. The calibration circuit of claim 1, wherein the digital calibration word is for measuring differential non-linearity (DNL) or integrated non-linearity (INL) performance of the ADC.

Example 12. A calibration circuit, comprising: a signal generator circuit configured to generate an analog input signal, which is based on a digital input word that is modulated; an Analog-to-Digital Converter (ADC) configured to convert an analog reference signal to a digital calibration word, wherein the analog reference signal is a low-pass-filtered version of the analog input signal generated by the signal generator circuit; and a feedback circuit configured to output the digital input word by adjusting the digital calibration word based on an analog feedback signal, which is based on the analog input signal, wherein the signal generator circuit, the ADC, and the feedback circuit are provided on a same chip.

Example 13. The calibration circuit of claim 12, wherein the feedback circuit comprises: a processor configured to adjust the digital input word based on the analog input signal of the signal generator circuit.

Example 14. The calibration circuit of claim 13, wherein the feedback circuit further comprises: a Low Pass Filter (LPF), coupled to the processor, and configured to low-pass-filter the analog input signal to output the analog feedback signal.

Example 15. The calibration circuit of claim 12, wherein the signal generator circuit comprises: a digital modulator configured to modulate the digital input word to output the analog input signal.

Example 16. The calibration circuit of claim 15, wherein the signal generator circuit further comprises: a driver, coupled to the digital modulator, and configured to drive the analog input signal output by the digital modulator to output the analog input signal.

Example 17. The calibration circuit of claim 15, wherein the digital modulator is a High Speed Pulse Density Modulator (HSPDM).

Example 18. The calibration circuit of claim 15, wherein the digital modulator is a delta-sigma Digital-to-Analog Converter (DAC), a pulse frequency digital modulator, a pulse width digital modulator, or a pulse code digital modulator.

Example 19. The calibration circuit of claim 12, wherein the ADC is a sample-and-hold ADC, a successive approximation register (SAR) ADC, or a pipelined ADC.

Example 20. The calibration circuit of claim 12, wherein the digital calibration word is for measuring differential non-linearity (DNL) or integrated non-linearity (INL) performance of the ADC.

Example 21. A calibration method, comprising: generating, by a signal generator circuit, a modulated analog input signal, which is based on a digital input word that is modulated; converting, by an Analog-to-Digital Converter (ADC), an analog reference signal to a digital calibration word, wherein the analog reference signal is a low-pass-filtered version of the analog input signal generated by the signal generator circuit; and outputting, by a feedback circuit, the digital input word by adjusting the digital calibration word depending on a digital feedback signal, which is based on a modulated version of the analog reference signal, wherein the signal generator circuit, the ADC, and the feedback circuit are provided on a same chip.

Example 22. The calibration method of claim 21, wherein the adjusting by the feedback circuit comprises: modulating, by an analog modulator, the analog reference signal into the modulated analog reference signal; and adjusting, by a processor, the digital input word of the signal generator circuit based on the digital feedback signal.

Example 23. The calibration method of claim 22, wherein the adjusting by the feedback circuit further comprises: low-pass-filtering, by a digital Low Pass Filter (LPF) coupled between the analog modulator and the processor, the modulated analog reference signal to output the digital feedback signal.

Example 24. The calibration method of claim 23, wherein the digital LPF is a cascaded integrator-comb (CIC) filter or a finite impulse response (FIR) filter.

Example 25. The calibration method of claim 22, wherein the generating by the signal generator circuit comprises: modulating, by a digital modulator, the digital input word to output the modulated analog input signal.

Example 26. The calibration method of claim 25, wherein the generating by the signal generator circuit further comprises: driving, by a driver coupled to the digital modulator, the analog input signal from the digital modulator to output the analog input signal.

Example 27. The calibration method of claim 25, wherein the digital modulator is a High Speed Pulse Density Modulator (HSPDM), and the analog modulator is an Enhanced Delta-Sigma (EDS) ADC.

Example 28. The calibration method of claim 25, wherein the digital modulator and analog modulator are of corresponding types.

Example 29. The calibration method of claim 28, wherein the digital modulator is a delta-sigma Digital-to-Analog Converter (DAC) and the analog modulator is a delta-sigma ADC, or the digital modulator is a pulse frequency digital modulator and the analog modulator is a pulse frequency analog modulator, or the digital modulator is a pulse width digital modulator and the analog modulator is a pulse width analog modulator, or the digital modulator is a pulse code digital modulator and the analog modulator is a pulse code analog modulator.

Example 30. The calibration method of claim 21, wherein the ADC is a sample-and-hold ADC, a successive approximation register (SAR) ADC, or a pipelined ADC.

Example 31. The calibration method of claim 21, wherein the digital calibration word is for measuring differential non-linearity (DNL) or integrated non-linearity (INL) performance of the ADC.

Example 32. A calibration method, comprising: generating, by a signal generator circuit, a modulated analog input signal, which is based on a digital input word that is modulated; converting, by an Analog-to-Digital Converter (ADC), an analog reference signal to a digital calibration word, wherein the analog reference signal is a low-pass-filtered version of the analog input signal generated by the signal generator circuit; and outputting, by a feedback circuit, the digital input word by adjusting the digital calibration word based on an analog feedback signal, which is based on the analog input signal, wherein the signal generator circuit, the ADC, and the feedback circuit are provided on a same chip.

Example 33. The calibration method of claim 32, wherein the adjusting by the feedback circuit comprises: adjusting, by a processor, the digital input word based on the analog input signal of the signal generator circuit.

Example 34. The calibration method of claim 33, wherein the adjusting by the feedback circuit further comprises: low-pass-filtering, by a Low Pass Filter (LPF) coupled to the processor, the analog input signal to output the analog feedback signal.

Example 35. The calibration method of claim 32, wherein the generating by the signal generator circuit comprises: modulating, by a digital modulator, the digital input word to output the analog input signal.

Example 36. The calibration method of claim 35, wherein the signal generator circuit further comprises: driving, by a driver coupled to the digital modulator, the analog input signal output by the digital modulator to output the modulated analog input signal.

Example 37. The calibration method of claim 35, wherein the digital modulator is a High Speed Pulse Density Modulator (HSPDM).

Example 38. The calibration method of claim 35, wherein the digital modulator is a delta-sigma Digital-to-Analog Converter (DAC), a pulse frequency digital modulator, a pulse width digital modulator, or a pulse code digital modulator.

Example 39. The calibration method of claim 32, wherein the ADC is a sample-and-hold ADC, a successive approximation register (SAR) ADC, or a pipelined ADC.

Example 40. The calibration method of claim 32, wherein the digital calibration word is for measuring differential non-linearity (DNL) or integrated non-linearity (INL) performance of the ADC.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

The invention claimed is:

1. A calibration circuit for calibrating an Analog-to-Digital Converter (ADC), comprising:
    a processor configured to generate a digital input word during a calibration;
    a signal generator circuit connected to the processor, the signal generator circuit being configured to generate a modulated analog input signal, which is based on the digital input word that is modulated;
    the ADC, which is configured to convert an analog reference signal to a digital calibration word, wherein the analog reference signal is a low-pass-filtered version of the analog input signal generated by the signal generator circuit; and
    a feedback circuit configured to output a digital feedback signal to the processor, the digital feedback signal being based on a modulated version of the analog reference signal, and
    wherein the signal generator circuit, the ADC, and the feedback circuit are provided on a same chip, and
    wherein the processor is further configured to, after the calibration, generate using the ADC the digital input word based on an analog signal while compensating for non-linear errors in the ADC using the digital calibration word.

2. The calibration circuit of claim 1, wherein the feedback circuit comprises:
    an analog modulator configured to modulate the analog reference signal into the modulated analog reference signal.

3. The calibration circuit of claim 2, wherein the feedback circuit further comprises:
    a digital Low Pass Filter (LPF), coupled between the analog modulator and the processor, and configured to low-pass-filter the modulated analog reference signal to output the digital feedback signal.

4. The calibration circuit of claim 3, wherein the digital LPF is a cascaded integrator-comb (CIC) filter or a finite impulse response (FIR) filter.

5. The calibration circuit of claim 2, wherein the signal generator circuit comprises:
    a digital modulator configured to modulate the digital input word to output the analog input signal.

6. The calibration circuit of claim 5, wherein the signal generator circuit further comprises:
    a driver, coupled to the digital modulator, and configured to drive the analog input signal from the digital modulator to output the modulated analog input signal.

7. The calibration circuit of claim 5, wherein the digital modulator is a High Speed Pulse Density Modulator (HSPDM), and the analog modulator is an Enhanced Delta-Sigma (EDS) ADC.

8. The calibration circuit of claim 5, wherein the digital modulator and analog modulator are of corresponding types.

9. The calibration circuit of claim 8, wherein the digital modulator is a delta-sigma Digital-to-Analog Converter (DAC) and the analog modulator is a delta-sigma ADC, or the digital modulator is a pulse frequency digital modulator and the analog modulator is a pulse frequency analog modulator, or the digital modulator is a pulse width digital modulator and the analog modulator is a pulse width analog modulator, or the digital modulator is a pulse code digital modulator and the analog modulator is a pulse code analog modulator.

10. The calibration circuit of claim 1, wherein the ADC is a sample-and-hold ADC, a successive approximation register (SAR) ADC, or a pipelined ADC.

11. The calibration circuit of claim 1, wherein the digital calibration word is for measuring differential non-linearity (DNL) or integrated non-linearity (INL) performance of the ADC.

12. A calibration circuit for calibrating an Analog-to-Digital Converter (ADC), comprising:
    a processor configured to generate a digital input word;
    a signal generator circuit connected to the processor, the signal generator circuit being configured to generate an analog input signal based on the digital input word;
    the ADC, which is configured to convert an analog reference signal to a digital calibration word, wherein the analog reference signal is a low-pass-filtered version of the analog input signal generated by the signal generator circuit; and
    a feedback circuit configured to output a digital feedback signal to the processor, wherein the digital feedback signal is based on the analog input signal, and
    wherein the signal generator circuit, the ADC, and the feedback circuit are provided on a same chip, and
    wherein the processor is configured to, after the calibration, generate using the ADC the digital input word based on an analog signal while compensating for non-linear errors in the ADC using the digital calibration word.

13. The calibration circuit of claim 12, wherein the feedback circuit further comprises:
    a Low Pass Filter (LPF), coupled to the processor, and configured to low-pass-filter the analog input signal to output the analog digital feedback signal.

14. The calibration circuit of claim 12, wherein the signal generator circuit comprises:
    a digital modulator configured to modulate the digital input word to output the analog input signal.

15. The calibration circuit of claim 14, wherein the signal generator circuit further comprises:
    a driver, coupled to the digital modulator, and configured to drive the analog input signal output by the digital modulator to output the analog input signal.

16. The calibration circuit of claim 14, wherein the digital modulator is a High Speed Pulse Density Modulator (HSPDM).

17. The calibration circuit of claim 14, wherein the digital modulator is a delta-sigma Digital-to-Analog Converter (DAC), a pulse frequency digital modulator, a pulse width digital modulator, or a pulse code digital modulator.

18. The calibration circuit of claim 12, wherein the ADC is a sample-and-hold ADC, a successive approximation register (SAR) ADC, or a pipelined ADC.

19. The calibration circuit of claim 12, wherein the digital calibration word is for measuring differential non-linearity (DNL) or integrated non-linearity (INL) performance of the ADC.

20. The calibration circuit of claim 1, wherein the chip is a chip of a microcontroller.

21. The calibration circuit of claim 12, wherein the chip is a chip of a microcontroller.

22. The calibration circuit of claim 1, wherein the processor is software or firmware based.

23. The calibration circuit of claim 12, wherein the processor is software or firmware based.

* * * * *